United States Patent
Hsieh et al.

(10) Patent No.: US 10,274,829 B2
(45) Date of Patent: Apr. 30, 2019

(54) MULTIPLE PATTERNING DECOMPOSITION AND MANUFACTURING METHODS FOR IC

(71) Applicant: Taiwan Semiconductor Manufacturing Co., Ltd., Hsinchu (TW)

(72) Inventors: Ken-Hsien Hsieh, Taipei (TW); Wen-Li Cheng, Taipei (TW); Pai-Wei Wang, Taoyuan (TW); Ru-Gun Liu, Zhubei (TW); Chih-Ming Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 18 days.

(21) Appl. No.: 15/689,244

(22) Filed: Aug. 29, 2017

(65) Prior Publication Data
US 2018/0164695 A1 Jun. 14, 2018

Related U.S. Application Data
(60) Provisional application No. 62/431,869, filed on Dec. 9, 2016.

(51) Int. Cl.
G03F 7/20 (2006.01)
G06F 17/50 (2006.01)
(Continued)

(52) U.S. Cl.
CPC ........... *G03F 7/70283* (2013.01); *G03F 1/22* (2013.01); *G03F 1/36* (2013.01); *G03F 1/68* (2013.01);
(Continued)

(58) Field of Classification Search
CPC .......... G03F 7/70283; G03F 1/68; G03F 1/70; G03F 7/70466; G03F 7/20; G03F 7/705;
(Continued)

(56) References Cited

U.S. PATENT DOCUMENTS

| | | | |
|---|---|---|---|
| 8,209,656 B1 * | 6/2012 | Wang | G03F 1/70 716/118 |
| 8,434,043 B1 * | 4/2013 | Hsu | G06F 17/5081 716/112 |

(Continued)

*Primary Examiner* — Nha T Nguyen
(74) *Attorney, Agent, or Firm* — McClure, Qualey & Rodack, LLP

(57) ABSTRACT

A multiple patterning decomposition method for IC is provided. Features of layout of IC are decomposed into a plurality of nodes. The nodes are classified to assign a plurality of first and second links between the nodes. First and second pseudo colors are assigned to a pair of nodes of each first link. The second links having a pair of nodes both corresponding to the first or second pseudo color are identified. The nodes of the first links are uncolored. A first real color is assigned to the two uncolored nodes of the identified second links in each of the networks. A second real color is assigned to the uncolored nodes connected to the nodes corresponding to the first real color through the first links. First and second masks are formed according to the nodes corresponding to the first and second real colors, respectively.

20 Claims, 9 Drawing Sheets

(51) Int. Cl.
*G03F 1/22* (2012.01)
*G03F 1/36* (2012.01)
*G03F 1/68* (2012.01)
*G03F 1/70* (2012.01)

(52) U.S. Cl.
CPC ............... *G03F 1/70* (2013.01); *G03F 7/705* (2013.01); *G03F 7/70433* (2013.01); *G03F 7/70466* (2013.01); *G06F 17/5045* (2013.01); *G06F 17/5081* (2013.01)

(58) Field of Classification Search
CPC .......... G03F 1/22; G03F 1/36; G03F 7/70433; G06F 17/50; G06F 17/5045; G06F 17/5081
See application file for complete search history.

(56) References Cited

U.S. PATENT DOCUMENTS

| | | | | |
|---|---|---|---|---|
| 8,448,100 B1* | 5/2013 | Lin | ............................ | G03F 1/70 716/50 |
| 8,484,607 B1* | 7/2013 | Tang | .................... | G03F 7/70466 716/136 |
| 8,516,402 B1* | 8/2013 | Wang | ........................ | G03F 1/70 716/52 |
| 8,647,893 B1* | 2/2014 | Agarwal | ............. | G06F 17/5081 257/E21.522 |
| 8,661,371 B1* | 2/2014 | Wang | .................... | G06F 17/5068 716/52 |
| 8,671,368 B1* | 3/2014 | Salowe | ............... | G06F 17/5077 716/126 |
| 8,677,297 B2* | 3/2014 | Chase | ................. | G06F 17/5081 716/111 |
| 8,689,151 B1* | 4/2014 | Agarwal | ............. | G03F 7/70466 716/50 |
| 8,719,737 B1* | 5/2014 | Wang | .................. | G06F 17/5081 716/50 |
| 8,732,628 B1* | 5/2014 | Wu | ............................ | G03F 1/38 430/30 |
| 8,935,639 B1* | 1/2015 | Tzeng | ................. | G06F 17/5077 430/30 |
| 8,949,747 B1* | 2/2015 | Wang | ........................ | G03F 1/70 716/54 |
| 9,158,885 B1* | 10/2015 | Gray | .................... | G03F 7/70433 |
| 9,165,104 B1* | 10/2015 | Wang | ........................ | G03F 1/70 |
| 9,292,646 B2* | 3/2016 | Lee | ....................... | G06F 17/5072 |
| 9,465,907 B2* | 10/2016 | Hassan | ............... | G06F 17/5068 |
| 9,747,407 B2* | 8/2017 | Choi | ................... | G06F 17/5081 |
| 9,842,185 B2* | 12/2017 | Riviere-Cazaux | ........................... | G03F 7/70433 |
| 2003/0143470 A1* | 7/2003 | Nolscher | .................... | G03F 1/36 430/5 |
| 2008/0318153 A1* | 12/2008 | Pforr | ......................... | G03F 7/11 430/270.1 |
| 2011/0193234 A1* | 8/2011 | Chen | .................... | H01L 27/0207 257/773 |
| 2011/0296360 A1* | 12/2011 | Wang | ..................... | G06F 17/5081 716/106 |
| 2012/0216157 A1* | 8/2012 | Luo | ..................... | G06F 17/5077 716/55 |
| 2013/0061186 A1* | 3/2013 | Hsu | ......................... | G06F 17/50 716/55 |
| 2013/0074018 A1* | 3/2013 | Hsu | ........................ | G03F 1/70 716/55 |
| 2014/0089868 A1* | 3/2014 | Friedberg | ........... | G06F 17/5081 716/52 |
| 2015/0012895 A1* | 1/2015 | Chen | ................... | G06F 17/5077 716/52 |
| 2017/0124242 A1* | 5/2017 | Sharma | ................. | G03F 7/0035 |
| 2017/0147740 A1* | 5/2017 | Chang | ................. | G06F 17/5081 |

\* cited by examiner

MULTIPLE PATTERNING DECOMPOSITION AND MANUFACTURING METHODS FOR IC

CROSS REFERENCE TO RELATED APPLICATIONS

This Application claims priority of U.S. Provisional Application No. 62/431,869, filed on Dec. 9, 2016, the entirety of which is incorporated by reference herein.

BACKGROUND

As a result of shrinkage of critical dimensions (CD), the dimensions of semiconductor devices have moved beyond the resolution limit. In semiconductor fabrication processes, the resolution of a photoresist pattern begins to blur at a half pitch of about 45 nanometers (nm). Thus, multi-exposure methods have been developed so that manufacturers can continue to use fabrication equipment purchased for larger technology nodes.

Multi patterning lithography (MPL) is one lithography strategy that is used in emerging technology nodes to overcome the limitations of lithographic resolution. Multiple exposure or multi-patterning technology (MPT) involves forming patterns on a single layer using two or more different masks in succession. As long as the patterns within each individual mask comply with the relevant minimum separation distances for the technology node, the combination of patterns formed by using the plural masks may include smaller spaces than the minimum separation distance. MPT allows line segments, and in some cases, vertices (angles) to be formed of a vertical segment and a horizontal segment on the same mask. Thus, MPT provides flexibility and generally allows for significant reduction in overall IC layout.

During MPL data prep, an original layout is decomposed into two or more colors (e.g., black and gray), such that nodes of the same color are formed on the same mask of a multiple patterning lithography exposure (e.g., a double patterning, triple patterning, etc.). By splitting IC layout data into multiple masks, printing below a printable threshold is enabled since the data on each of the separate masks does not violate the printable threshold.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
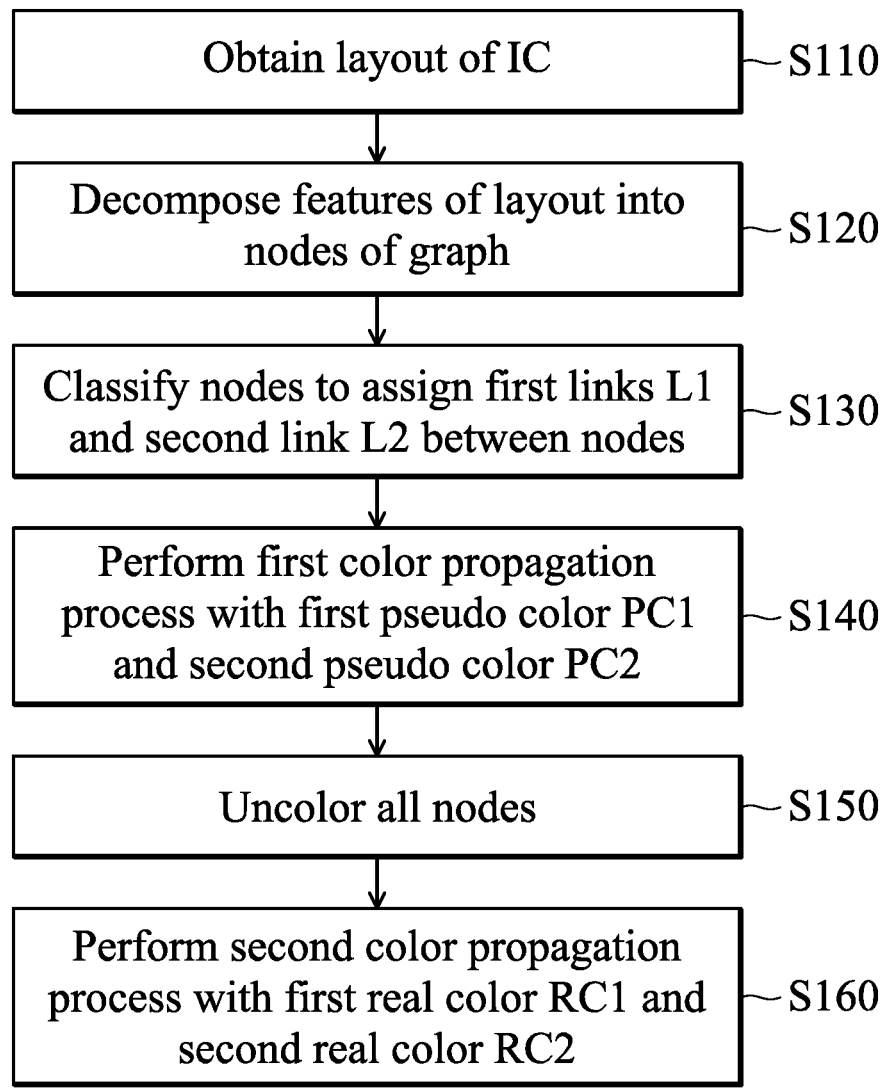
FIG. 1 shows a simplified flowchart illustrating a multiple patterning decomposition method for an integrated circuit (IC), in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

In integrated circuit (IC) design, a variety of functions are integrated into one chip, and an application specific integrated circuit (ASIC) or system on a chip (SOC) cell based design is often used. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells, which contain prefigured elements such as transistors. The cells are chosen with the particular semiconductor process nodes and parameters in mind and create a process parameterized physical representation of the design. The design flow continues from that point by performing placement and routing of the local and global connections needed to form the completed design using the standard cells.

After design rule checks, design rule verification, timing analysis, critical path analysis, static and dynamic power analysis, and final modifications to the design, a tape out process is performed to produce photomask generation data. This photomask generation (PG) data is then used to create the optical masks used to fabricate the semiconductor device in a photolithographic process at a wafer fabrication facility (FAB). In the tape out process, the database file of the IC is converted into a Graphic Database System (GDS) file (e.g., a GDS file or a GDSII file). The GDS file is then used to make various layers of masks for integrated circuit manufacturing. Specifically, the GDS file became the industry's standard format for transfer of IC layout data between design tools of different vendors.

IC layers having small minimum dimensions are decomposed to form a multiple mask set for performing a multiple patterning lithography (MPL). Decomposition of an IC layout is performed according to an algorithm that assigns different colors (corresponding to different mask exposures) to adjacent shapes separated by a space that is smaller than a printable threshold and that randomly assigns colors to adjacent shapes separated by a space that is greater than or equal to the printable threshold. Shapes assigned the same color are then written to the same mask of a multiple patterning lithography exposure (e.g., a double patterning, triple patterning, quadruple patterning, etc.) so as to enable printing below the printable threshold.

FIG. 1 shows a simplified flowchart illustrating a multiple patterning decomposition method for an integrated circuit (IC), in accordance with some embodiments of the disclosure. In some embodiments, the multiple patterning decomposition method is performed by a processor capable of executing an electronic design automation (EDA) tool.

In operation S110, at least one layer of a layout of the IC is obtained. The layout of the IC includes multiple features of the circuits of the IC, and the features are obtained according to a graphic data system (GDS) information of at least the layer of the IC. In some embodiments, the feature is formed by a polygon.

In operation S120, the features of the layout are decomposed into multiple nodes (or vertices) in a graph corresponding to the layout. Each feature corresponds to the individual node. Therefore, the number of features of the layout is identical to the number of nodes.

In operation S130 of FIG. 1, the nodes are classified to assign multiple first links L1 and multiple second links L2 between the nodes in the graph. In some embodiments, two adjacent nodes are connected by the first link L1 or the second link L2 according to the narrowest dimension between the features corresponding to the two adjacent nodes.

Figure 2:
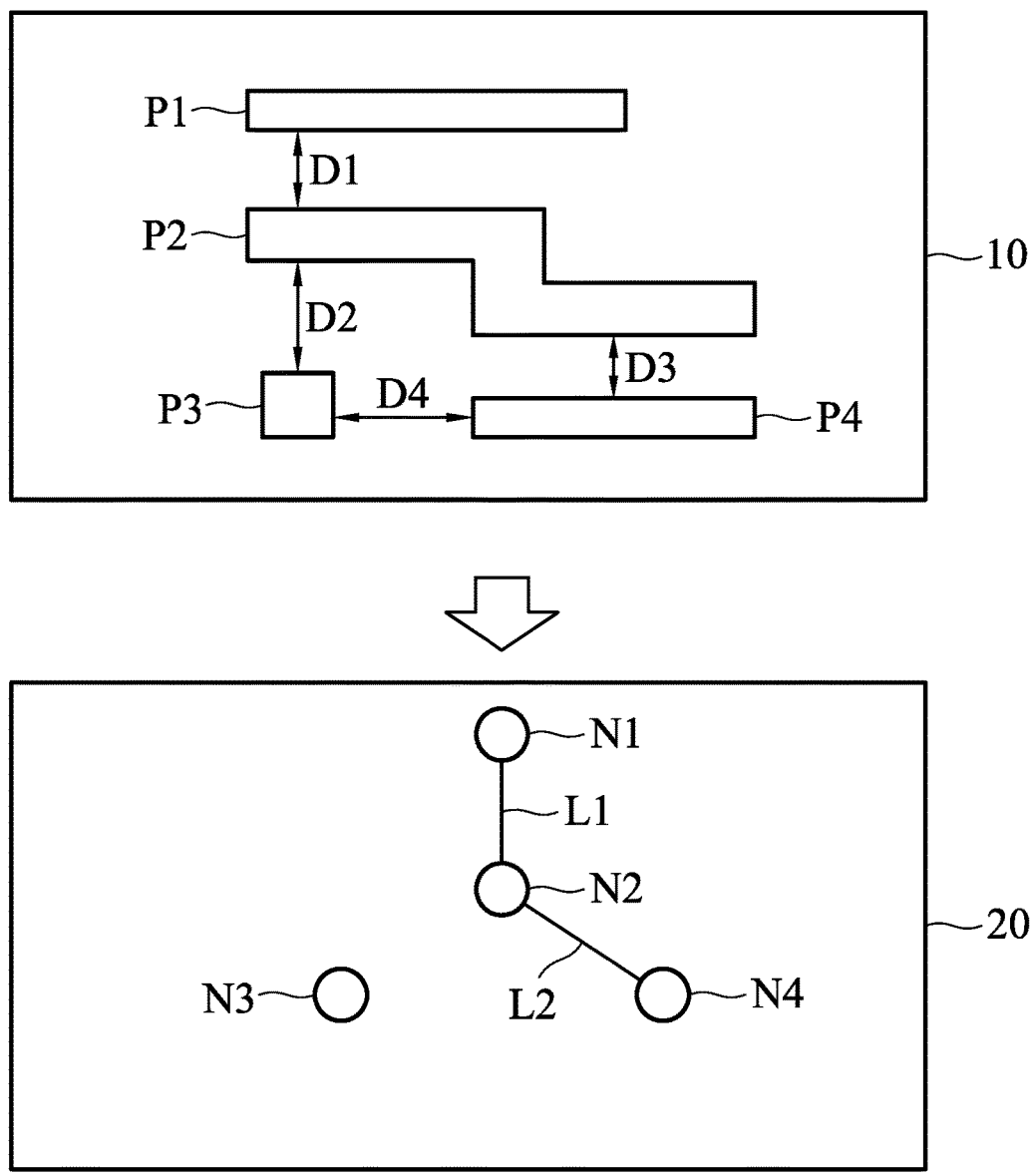
FIG. 2 shows an exemplary diagram illustrating how to decompose multiple features of a layout of an IC into multiple nodes of a graph of the IC, in accordance with some embodiments of the disclosure.

Referring to FIG. 2, FIG. 2 shows an exemplary diagram illustrating how to decompose multiple features P1-P4 of a layout 10 of an IC into multiple nodes N1-N4 of a graph 20 of the IC, in accordance with some embodiments of the disclosure. In FIG. 2, the features P1-P4 of the layout 10 correspond to the nodes N1-N4 of the graph 20, respectively. In the layout 10, D1 represents the narrowest dimension between the features P1 and P2, D2 represents the narrowest dimension between the features P2 and P3, D3 represents the narrowest dimension between the features P2 and P4, and D4 represents the narrowest dimension between the features P3 and P4. In such embodiments, the narrowest dimension D1 between the features P1 and P2 is smaller than a first threshold value S1 (i.e. D1<S1), and the two adjacent nodes N1 and N2 corresponding to the features P1 and P2 are connected by the first link L1. The narrowest dimension D3 between the features P2 and P4 is larger than or equal to the first threshold value S1 and smaller than a second threshold value S2 (i.e. S1≤D3<S2), and the two adjacent nodes N2 and N4 are connected by the second link L2. Furthermore, the narrowest dimension D2 between the features P2 and P3 is larger than the second threshold value S2 (i.e. D2>S2), no second link L2 is connected between the nodes N2 and N3. Similarly, the narrowest dimension D4 between the features P3 and P4 is larger than the second threshold value S2 (i.e. Dd>S2), no second link L2 is connected between the nodes N3 and N4. In some embodiments, the first threshold value S1 and the second threshold value S2 are the printable thresholds for different exposure machines.

Figure 3:
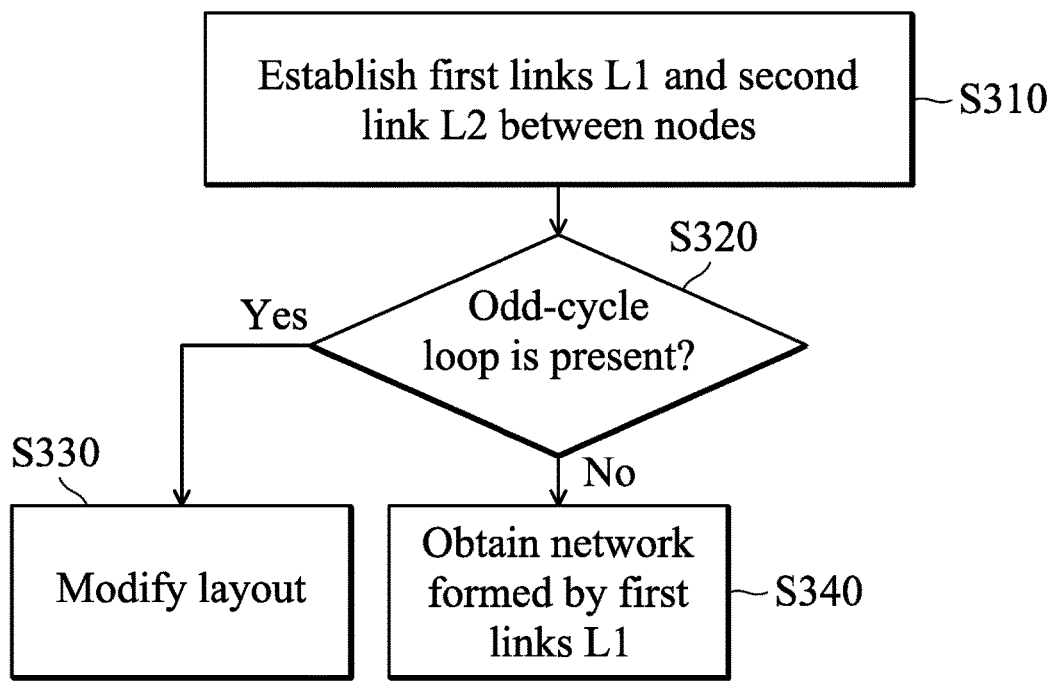
FIG. 3 shows a simplified flowchart illustrating operation S130 of FIG. 1, in accordance with some embodiments of the disclosure.

FIG. 3 shows a simplified flowchart illustrating operation S130 of FIG. 1, in accordance with some embodiments of the disclosure.

In operation S310, various types of links are established between the nodes in the graph according to a decomposition condition. In some embodiments, the decomposition condition indicates that the type of link between two adjacent nodes is determined according to the narrowest dimension between the two features corresponding to the two adjacent nodes. As described above, two adjacent nodes are connected by a first link L1 when the narrowest dimension D between the features corresponding to the two adjacent nodes is smaller than a first threshold value S1 in a layout, e.g., D<S1. Furthermore, two adjacent nodes are connected by a second link L2 when the narrowest dimension D between the features corresponding to the two adjacent nodes is larger than or equal to the first threshold value S1 and smaller than a second threshold value S2 in the layout, e.g., S1≤D<S2.

In some embodiments, two adjacent nodes are not connected by the first link L1 or the second link L2 when the narrowest dimension D between the features corresponding to the two adjacent nodes is larger than or equal to the second threshold value S2, e.g., S2≤D.

In some embodiments, two adjacent nodes are connected by a third link L3 when the narrowest dimension D between the features corresponding to the two adjacent nodes is larger than or equal to the second threshold value S2, e.g., S2≤D.

In operation S320, it is determined whether an odd-cycle loop is present in the graph. In some embodiments, the odd-cycle loop is a loop formed by odd first links and odd nodes. If the odd-cycle loop is present in the graph, the layout corresponding to the graph is modified in operation S330, and then the flowchart of the multiple patterning decomposition method in FIG. 1 is performed again for the modified layout. Conversely, if no odd-cycle loop is present in the graph, multiple networks formed by the interconnected first links are obtained in the graph (in operation S340). In some embodiments, the networks are connected by the second links L2 in the graph.

Figure 4:
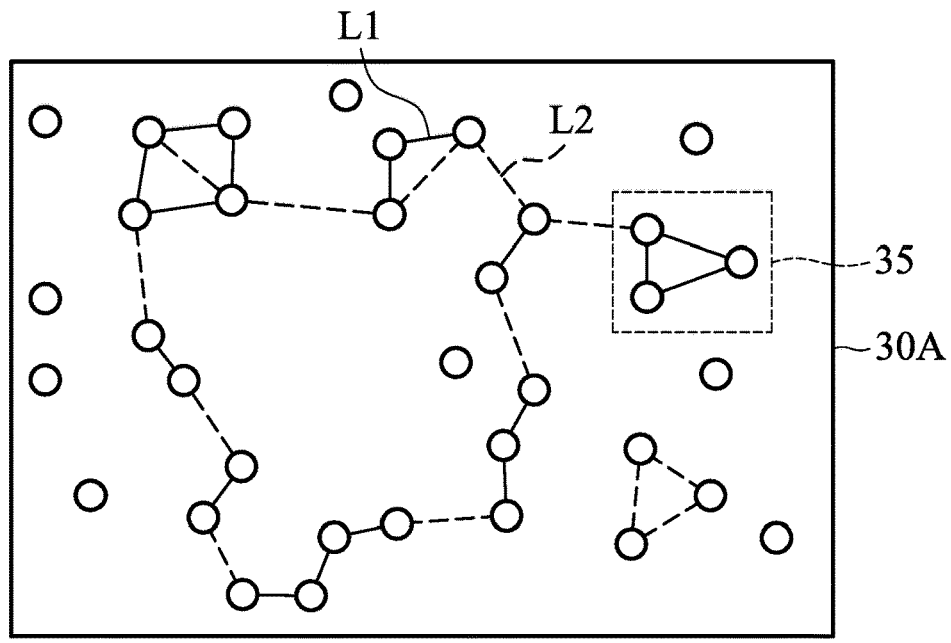
FIG. 4 shows an exemplified diagram illustrating a graph having multiple first links L1 and multiple second links L2, in accordance with some embodiments of the disclosure.

Referring to FIG. 4, FIG. 4 shows an exemplary diagram illustrating a graph 30A having multiple first links L1 and multiple second links L2, in accordance with some embodiments of the disclosure. As described in operation S310 of FIG. 3, two adjacent nodes are connected by the first link L1 (shown with a solid line) when the narrowest dimension D between the features corresponding to the two adjacent nodes is smaller than a first threshold value S1 in a layout, e.g., D<S1. Furthermore, two adjacent nodes are connected by the second link L2 (shown with a dashed line) when the narrowest dimension D between the features corresponding to the two adjacent nodes is larger than or equal to the first threshold value S1 and smaller than a second threshold value S2 in the layout, e.g., S1≤D<S2. Moreover, the narrowest dimension D between the features corresponding to the two adjacent nodes is larger than or equal to the second threshold value S2, no first link L1 or second link L2 is connected (or assigned) between the two adjacent nodes, thus some nodes are not associated with other nodes through the first link L1 and the second link L2, i.e. the nodes are independent nodes.

In the graph 30A of FIG. 4, an odd-cycle loop 35 is present, and the odd-cycle loop is formed by three nodes connected to each other through the first links L1. As described in the flowchart of FIG. 3, when it is determined that the odd-cycle loop 35 is present in the graph 30A (in operation S320), the layout corresponding to the graph 30A is modified (in operation S330), and then the flowchart of the multiple patterning decomposition method in FIG. 1 is performed again for the modified layout.

Figure 5:
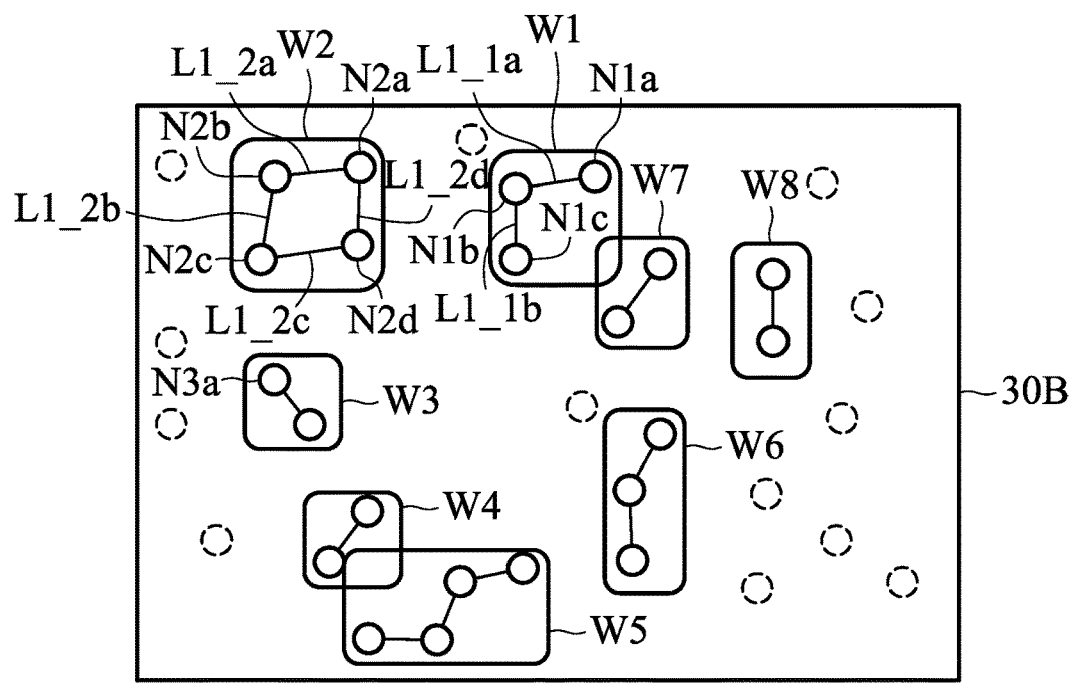
FIG. 5 shows an exemplary diagram illustrating a graph having multiple networks obtained in operation S340 of FIG. 3, in accordance with some embodiments of the disclosure.

FIG. 5 shows an exemplary diagram illustrating a graph 30B having multiple networks W1-W8 obtained in operation S340 of FIG. 3, in accordance with some embodiments of the disclosure. Compared with the graph 30A of FIG. 4, no odd-cycle loop (e.g., 35 of FIG. 4) is present in the graph 30B. Furthermore, in order to simplify the description, the second links L2 are omitted in FIG. 5. As described in the flowchart of FIG. 3, when it is determined that no odd-cycle loop is present in the graph 30B (in operation S320), the networks W1-W8 formed by the first links L1 are obtained in the graph 30B (in operation S340).

In the graph 30B of FIG. 5, each of the networks W1-W8 is formed by the interconnected nodes. For example, the network W1 includes the nodes N1a, N1b and N1c. In the network W1, the nodes N1a and N1b are connected by the first link L1_1a, and the nodes N1b and N1c are connected by the first link L1_1b. Furthermore, the network W2 includes the nodes N2a, N2b, N2c and N2d. In the network W2, the nodes N2a and N2b are connected by the first link L1_2a, the nodes N2b and N2c are connected by the first link L1_2b, the nodes N2c and N2d are connected by the first link L1_2c, and the nodes N2d and N2a are connected by the first link L1_2d. In such embodiments, the nodes N2a, N2b, N2c and N2d form an even-cycle loop.

Referring back to the flowchart of FIG. 1, after the first links L1 and the second links L2 are assigned between the nodes in the graph (in operation S130), a first color propagation process is performed in operation S140, to assign a first pseudo color PC1 and a second pseudo color PC2 to the nodes of the first links L1 and the second links L2 in the graph. In some embodiments, the independent nodes will not be colored with the first pseudo color PC1 or the second pseudo color PC2 in the first color propagation process.

Figure 6:
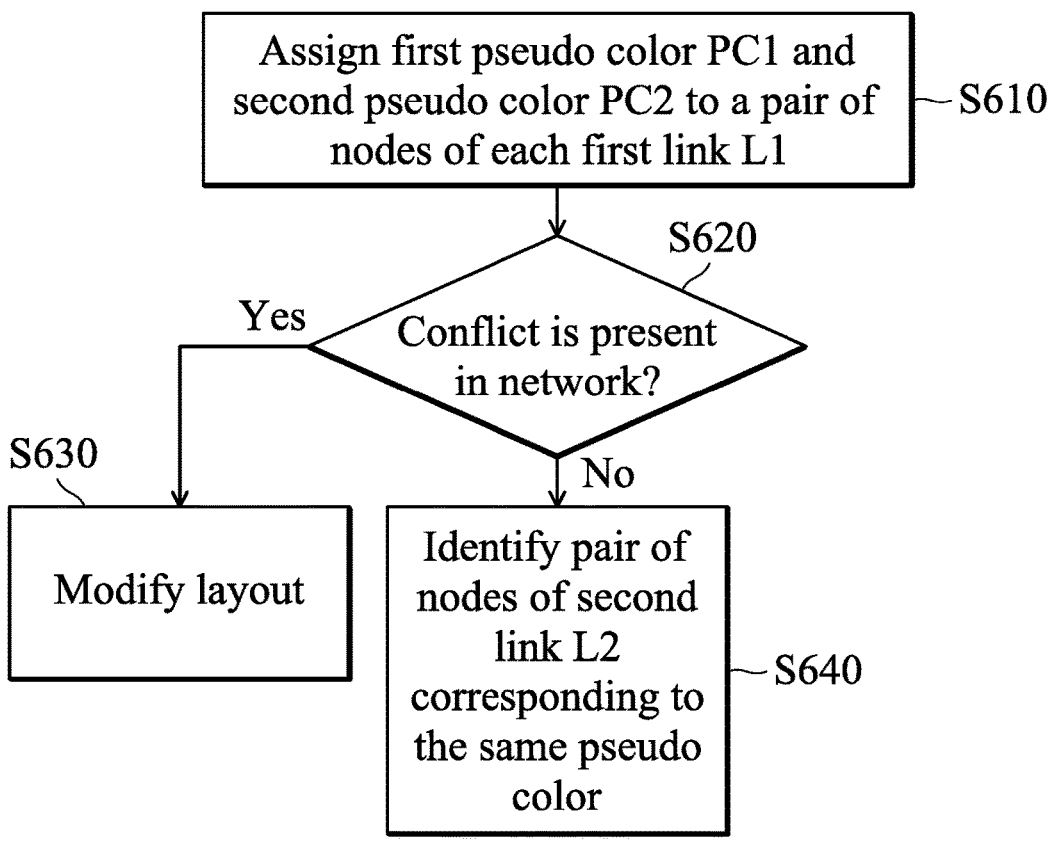
FIG. 6 shows a simplified flowchart illustrating the first color propagation process in operation S140 of FIG. 1, in accordance with some embodiments of the disclosure.

Referring to FIG. 6, FIG. 6 shows a simplified flowchart illustrating the first color propagation process in operation S140 of FIG. 1, in accordance with some embodiments of the disclosure.

In operation S610, the first pseudo color PC1 and the second pseudo color PC2 are assigned to a pair of nodes of each first link L1, so as to pre-color the nodes. As described above, two adjacent nodes are connected through the first link L1 when the narrowest dimension D between the features corresponding to the two adjacent nodes is smaller than a first threshold value S1 in a layout. For the pair of nodes in the first link L1, the first pseudo color PC1 is assigned to one node, and the second pseudo color PC2 is assigned to the other node.

In operation S620, it is determined whether the first pseudo color PC1 is simultaneously assigned to a first pair of nodes of one of the second links L2 and the second pseudo color PC2 is simultaneously assigned to a second pair of nodes of the other second link L2 in the same network, i.e. whether a conflict is present in the network of the graph. As described above, two adjacent nodes are connected by a second link L2 when the narrowest dimension D between the features corresponding to the two adjacent nodes is greater than or equal to a first threshold value S1 and smaller than a second threshold value S2 in a layout, e.g., S1≤D<S2. If the first pair of nodes is pre-colored with one pseudo color (e.g., PC1) and the second pair of nodes is pre-colored with the other pseudo color (e.g., PC2), a conflict is present in the network. If the conflict is present in the networks in the graph, the layout corresponding to the graph is modified in operation S630, and then the flowchart of the multiple patterning decomposition method in FIG. 1 is performed again for the modified layout. Conversely, if no conflict is present in the graph, the pair of nodes of the second link L2 corresponding to the same pseudo color is identified in each network (in operation S640).

Figure 7:
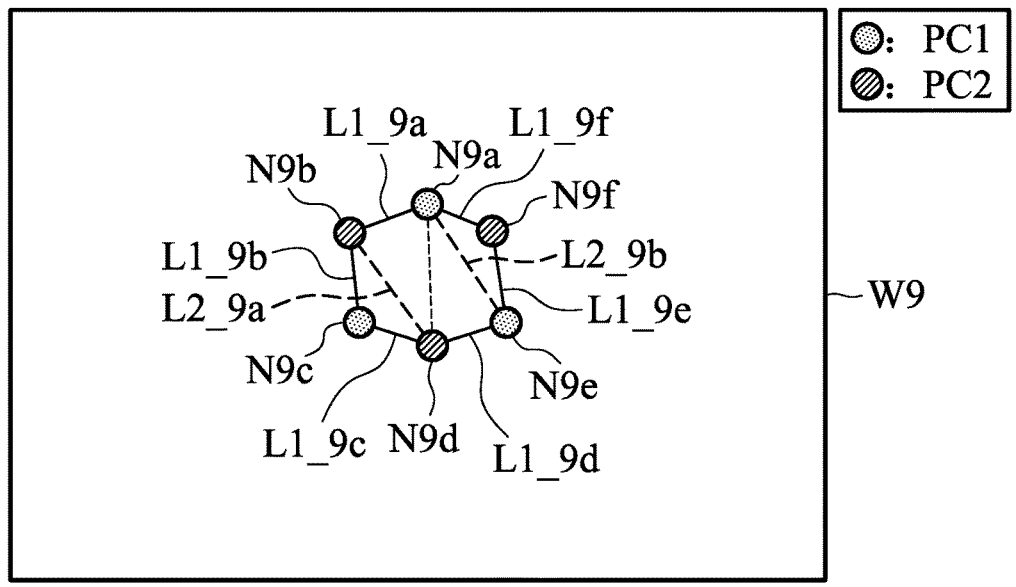
FIG. 7 shows an exemplary diagram illustrating a network W9 having the conflict determined in operation S620 of FIG. 6, in accordance with some embodiments of the disclosure.

FIG. 7 shows an exemplary diagram illustrating a network W9 having the conflict determined in operation S620 of FIG. 6, in accordance with some embodiments of the disclosure. In the network W9, the first pseudo color PC1 is assigned to the nodes N9a, N9c, and N9e, and the second pseudo color PC2 is assigned to the nodes N9b, N9d, and N9f for the first links L1_9a-L1_9f. In the network W9, the nodes N9b and N9d are further connected to each other through the second link L2_9a, and the nodes N9b and N9d are pre-colored with the second pseudo color PC2. Furthermore, the nodes N9a and N9e are further connected to each other through the second link L2_9b, and the nodes N9a and N9e are pre-colored with the first pseudo color PC1. The first pseudo color PC1 is simultaneously assigned to the pair of nodes of the second link L2_9b and the second pseudo color PC2 is simultaneously assigned to the pair of nodes of the second link L2_9a in the network W9, thus the conflict is present in the network W9. As described above, the layout corresponding to the graph having the network W9 is modified in operation S630, and then the flowchart of the multiple patterning decomposition method in FIG. 1 is performed again for the modified layout.

Figure 8:
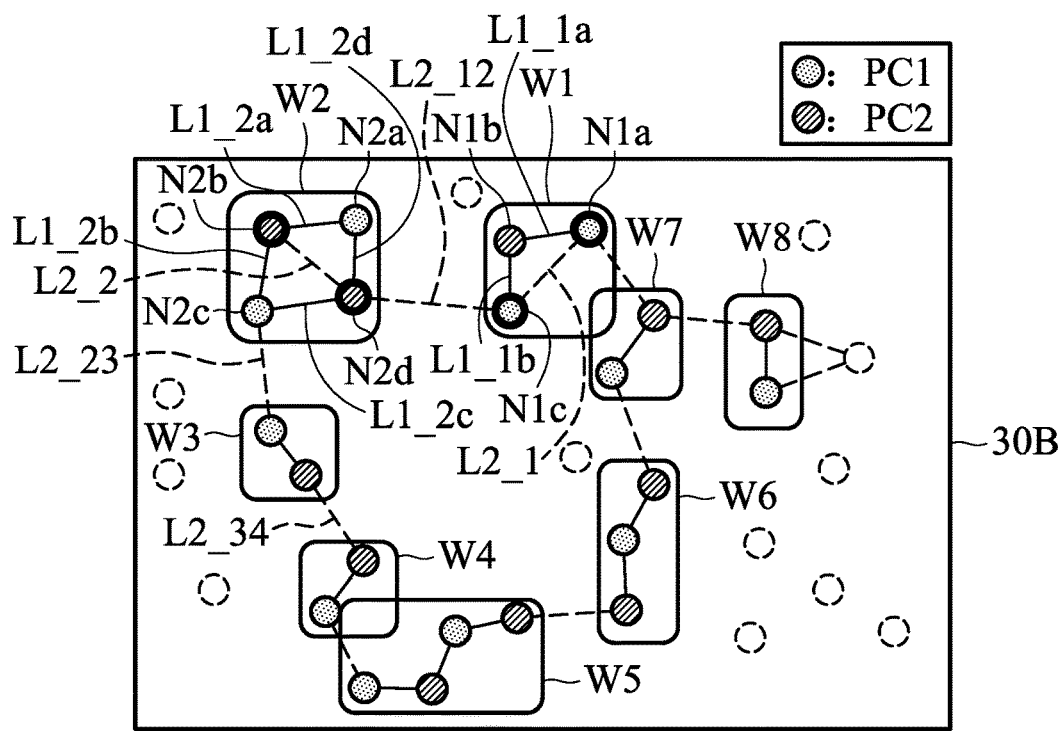
FIG. 8 shows an exemplified diagram illustrating the graph having the nodes pre-colored in operation S610 of FIG. 6 and the identified nodes of the second links L2 in operation S640 of FIG. 6, in accordance with some embodiments of the disclosure.

FIG. 8 shows an exemplary diagram illustrating the graph 30B having the nodes pre-colored in operation S610 of FIG. 6 and the identified nodes of the second links L2 in operation S640 of FIG. 6, in accordance with some embodiments of the disclosure. In the network W1, the first pseudo color PC1 is assigned to the node N1a and the second pseudo color PC2 is assigned to the node N1b for the first link L1_1a. For the first link L1_1b, the first pseudo color PC1 is assigned to the node N1c due to the second pseudo color PC2 being assigned to the node N1b. Therefore, when the node (e.g., Nib) connected to the other nodes (e.g., N1a and N1c) through multiple first links L1 (e.g., L1_1a and L1_1b) is pre-colored with one pseudo color (e.g., PC2), the other nodes are pre-colored with the other pseudo color (e.g., PC1).

In the network W2 of FIG. 8, the first pseudo color PC1 is assigned to the node N2a and the second pseudo color PC2 is assigned to the node N2b for the first link L1_2a. For the first link L1_2b, the first pseudo color PC1 is assigned to the node N2c due to the second pseudo color PC2 being assigned to the node N2b. Furthermore, the second pseudo color PC2 is assigned to the node N2d due to the first pseudo color PC1 being assigned to the node N2c for the first link L1_2C. For the first link L1_2d, the first pseudo color PC1 is assigned to the node N2a, and the second pseudo color PC2 is assigned to the node N2d. Therefore, for each first link L1, two different pseudo colors (e.g., PC1 and PC2) are assigned to the pair of nodes of each first link in operation S610 of FIG. 6.

In the graph 30B of FIG. 8, the networks W1-W8 are connected through the second links L2. For example, the node N1c of the network W1 is connected to the node N2d of the network W2 through the second link L2_12, thus the networks W1 and W2 are connected through the second link L2_12. Similarly, the networks W2 and W3 are connected through the second link L2_23, the networks W3 and W4 are connected through the second link L2_34, and so on.

In some networks, a pair of nodes is connected by the second link L2 when the narrowest dimension (or space) D between the features corresponding to the pair of nodes is larger than or equal to the first threshold value S1 and smaller than a second threshold value S2 in the layout, e.g., S1≤D<S2. In FIG. 8, the nodes N1a and N1c are connected through the second link L2_1 in the network W1, and the nodes N2b and N2d are connected through the second link L2_2 in the network W2. Therefore, the nodes N1a and N1c corresponding to the same second pseudo color PC2 are identified for the second link L2_1 in the network W1, and the nodes N2b and N2d corresponding to the same second pseudo color PC2 are identified for the second link L2_2 in the network W1 in operation S640 of FIG. 6. In the graph 30B of FIG. 8, the identified nodes of the second link L2 are shown in bold.

Referring back to the flowchart of FIG. 1, after the pair of nodes of the second link L2 corresponding to the same pseudo color are identified in the networks of the graph in the first color propagation process of operation S140, all nodes in the graph are uncolored in operation S150. Therefore, the first pseudo color PC1 and the second pseudo color PC2 are removed from the nodes of the graph.

In operation S160, a second color propagation process is performed to assign a first real color RC1 and a second real color RC2 to the uncolored nodes in the graph based on the identified nodes of the second link L2. In the second color propagation process, the first real color RC1 is assigned to the pair of identified nodes of the second links L2 in each network first, and then the second real color RC2 and the first real color RC1 are propagated from the first assigned nodes in sequence. Specifically, the pair of identified nodes of the second links L2 in each network are the starting nodes for propagating the first real color RC1 and the second real color RC2.

Figure 9:
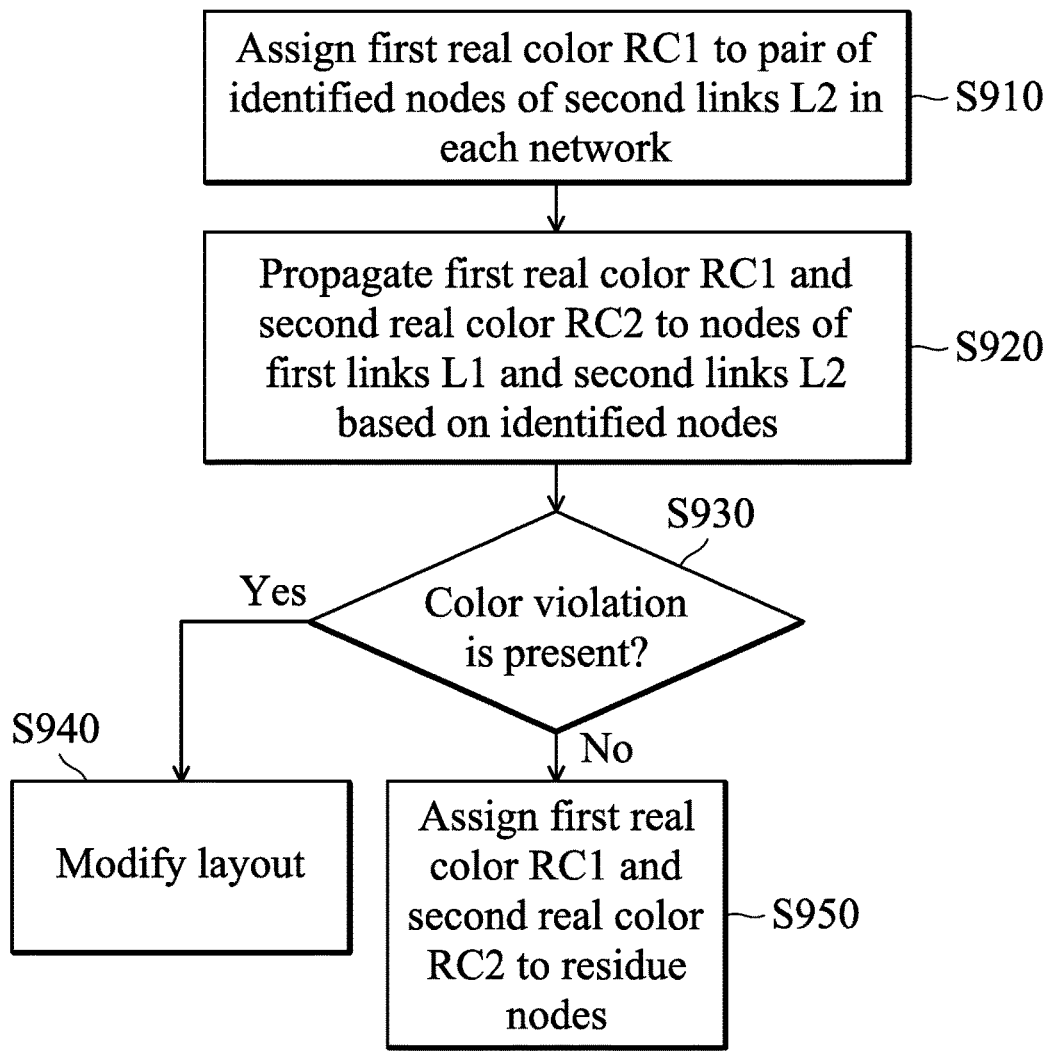
FIG. 9 shows a simplified flowchart illustrating the second color propagation process in operation S160 of FIG. 1, in accordance with some embodiments of the disclosure.

FIG. 9 shows a simplified flowchart illustrating the second color propagation process in operation S160 of FIG. 1, in accordance with some embodiments of the disclosure.

In operation S910, the first real color RC1 is assigned to the pair of identified nodes of the second links L2 in each network, and the identified pair of nodes of the second links L2 are obtained in the operation S640 of the first color propagation process of FIG. 6.

In operation S920, after the identified nodes are colored with the first real color RC1, the identified nodes are used as the starting points for propagating the first real color RC1 and the second real color RC2 to the nodes through the first links L1 and the second links L2. As described above, two different real colors (e.g., RC1 and RC2) are assigned to the pair of nodes of each first link.

In operation S930, it is determined whether the pair of nodes of the second link L2 correspond to the same second real color RC2, i.e. a color violation is present in the graph.

If the second real color RC2 is simultaneously assigned to the pair of nodes for the second link L2, the color violation is present and the layout corresponding to the graph is modified in operation S940, and then the flowchart of the multiple patterning decomposition method in FIG. 1 is performed again for the modified layout. Conversely, if no color violation is present in the graph, the residue nodes are colored with the first real color RC1 and/or the second real color RC2 in operation S950. In some embodiments, the residue nodes are the independent nodes that are not connected to other nodes of the networks through the first links L1 and the second links L2.

After all nodes are colored with the first real color RC1 or the second real color RC2, a first mask of the layer of the IC is provided according to the nodes corresponding to the first real color RC1, and a second mask of the layer of the IC is provided according to the nodes corresponding to the second real color RC2. It should be noted that the first and second masks are used in different exposure machines having individual resolutions corresponding to one or more factors, such as wavelength of ultraviolet light, numerical aperture (NA), illumination shape, mask type/process, or photoresist, and the individual resolutions are not alike. Specifically, the first and second masks cannot be used in exposure machines with the same resolutions.

Figure 10A:
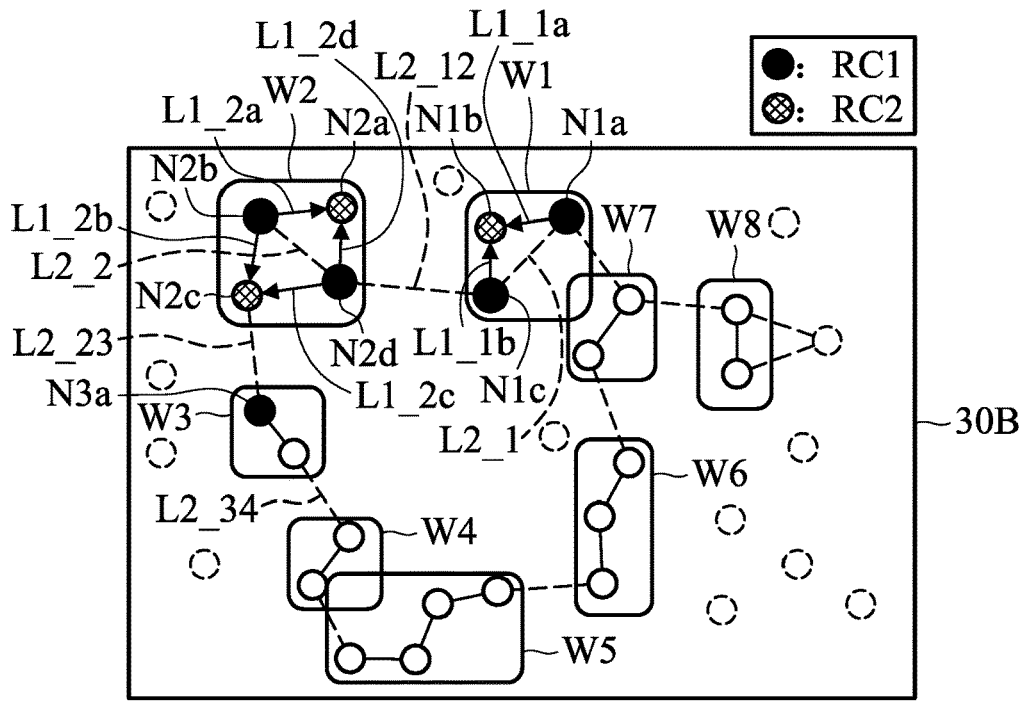
FIG. 10A shows an exemplary diagram illustrating the graph having the nodes colored in operation S920 of FIG. 9, in accordance with some embodiments of the disclosure.

FIG. 10A shows an exemplary diagram illustrating the graph 30B having the nodes colored in operation S920 of FIG. 9, in accordance with some embodiments of the disclosure. As described above, the identified nodes N1a and N1c of the second link L2_1 and the identified nodes N2b and N2d of the second link L2_2 are colored with the first real color RC1. Taking the identified node N2b of the network W2 as the starting point for description, the second real color RC2 is assigned to the node N2c coupled to the node N2b through the first link L1_2b, and the second real color RC2 is also assigned to the node N2a coupled to the node N2b through the first link L1_2b. Next, the first real color RC1 is assigned to the node N3a of network W3 coupled to the node N2c through the second link L2_23, and so on.

Figure 10B:
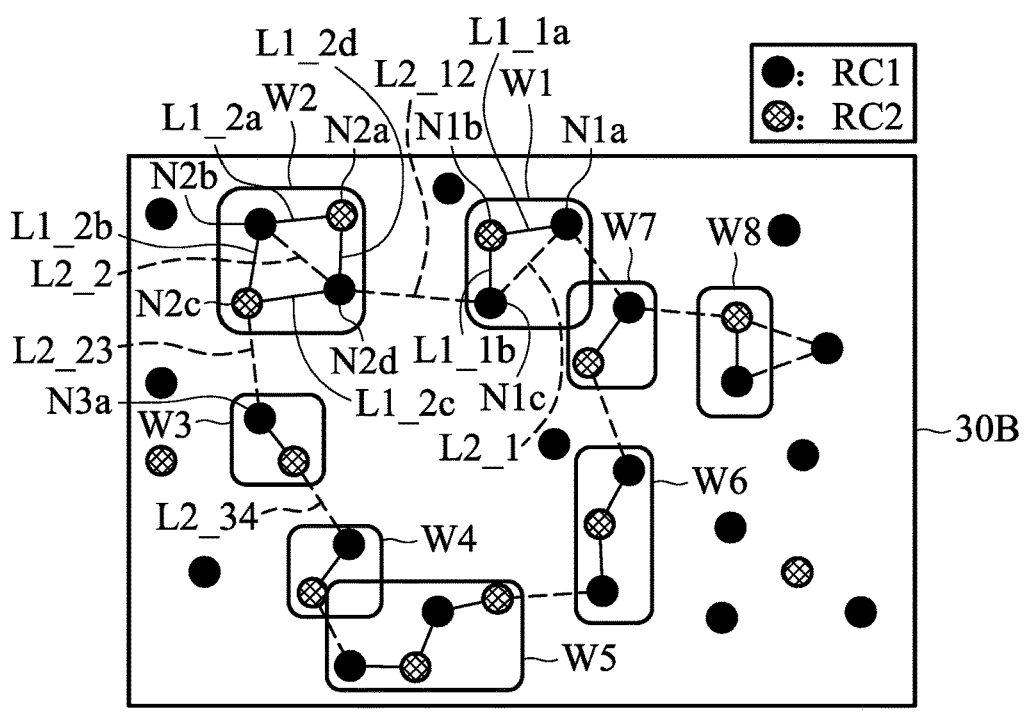
FIG. 10B shows an exemplary diagram illustrating the graph with the residue nodes colored in operation S950 of FIG. 9, in accordance with some embodiments of the disclosure.

FIG. 10B shows an exemplary diagram illustrating the graph 30B with the residue nodes colored in operation S950 of FIG. 9, in accordance with some embodiments of the disclosure. In the graph 30B of FIG. 10B, there is no color violation caused by the pair of the nodes of the second link L2 corresponding to the same second real color RC2. In some embodiments, the residue nodes are colored according to the loading balance of the first and second masks. Furthermore, when the first real color RC1 and/or the second real color RC2 are assigned to the residue nodes, it should be noted to avoid any unwanted configuration on the same mask.

In the graph 30B of FIG. 10B, for each first link L1, the pair of nodes of the first link L1 is assigned to the different real colors (e.g., RC1 and RC2). For each second link L2, the pair of nodes of the second link L2 is assigned to the different real colors (e.g., RC1 and RC2) or the same first real color RC1.

Except for the first link L1 and the second link L2, an extra link can be increased. For example, two adjacent nodes are connected by a third link L3 when the narrowest dimension D between the features corresponding to the two adjacent nodes is larger than or equal to the second threshold value S2 and smaller than a third threshold value S3 in the layout, e.g., S2≤D<S3. Furthermore, two adjacent nodes are not connected by the first link L1, the second link L2 or the third link L3 when the narrowest dimension D between the features corresponding to the two adjacent nodes is larger than or equal to the third threshold value S3, e.g., S3<D. For each third link L3, the pair of nodes of the third link L3 is assigned to the different real colors (e.g., RC1 and RC2) or the second first real color RC2.

As described above, a multiple patterning lithography process is performed with the first mask corresponding to the first real color RC1 and the second mask corresponding to the second real color RC2. A first exposure machine (not shown) having a first resolution corresponding to a shorter wavelength (e.g., 157 nm) of ultraviolet light and a second resolution corresponding to a second exposure machine (not shown) with a longer wavelength (e.g., 193 nm) of ultraviolet light are used to fabricate the IC according to the first and second masks. When the wavelength of ultraviolet light is decreased, the sizes of the features of the IC are decreased. As described above, the resolution of the exposure machine is determined according to one or more factors, such as wavelength of ultraviolet light, numerical aperture (NA), illumination shape, mask type/process, or photo-resist.

Figure 11:
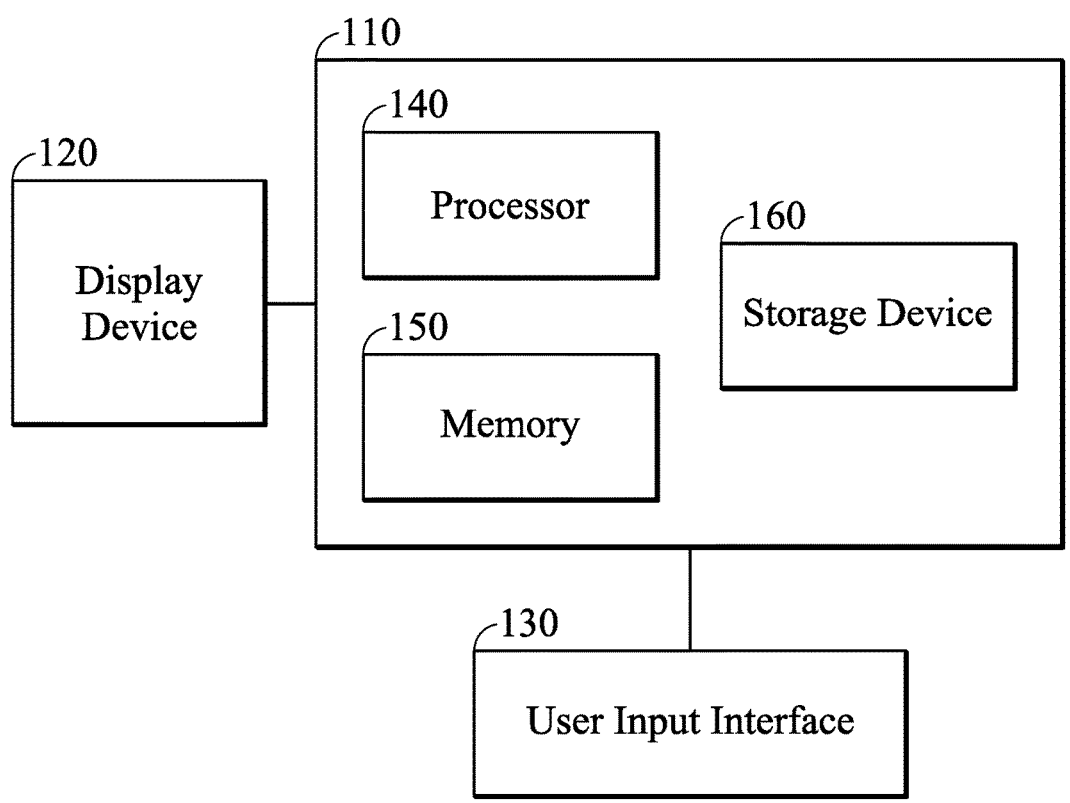
FIG. 11 shows a computer system, in accordance with some embodiments of the disclosure.

FIG. 11 shows a computer system 100, in accordance with some embodiments of the disclosure. The computer system 100 includes a computer 110, a display device 120 and a user input interface 130, wherein the computer 110 includes a processor 140, a memory 150, and a storage device 160. The computer 110 is coupled to the display device 120 and the user input interface 130, wherein the computer 110 is capable of operating an electronic design automation (EDA) tool. Furthermore, the computer 110 is capable of receiving the information regarding the layout of the IC and displaying the features in the layout, and nodes corresponding to the features of the layout in a graph on the display device 120. In some embodiments, the display device 120 is a GUI for the computer 110. Furthermore, the display device 120 and the user input interface 130 can be implemented in the computer 110. The user input interface 130 may be a keyboard, a mouse and so on. In the computer 110, the storage device 160 can store the operating systems (OSs), applications, and data that include input required by the applications and/or output generated by applications. The processor 140 of the computer 110 can perform one or more operations (either automatically or with user input) in any method that is implicitly or explicitly described in this disclosure. Furthermore, during operation, the processor 140 can load the applications of the storage device 160 into the memory 150, and then the applications can be used to create, view, and/or edit the related masks for IC design.

Embodiments for multiple patterning decomposition method for IC are provided. A layout of the IC is decomposed into a plurality of nodes in a graph. The nodes are classified to assign the first link L1 and the second link L2 to the nodes. In some embodiments, the first links L1 form various networks, and the networks are connected through the second link L2. In a pre-color process, the first pseudo color PC1 and the second pseudo color PC2 are assigned to the nodes of the first links L1. If no conflict is present in the graph, the pair of nodes of the second link L2 corresponding to the same color is identified in each network, and the nodes are uncolored. Based on the identified nodes of the second link L2, a second color propagation process is performed to assign the first real color RC1 and the second real color RC2 to the uncolored nodes in the graph. If no color violation is present in the graph, the nodes colored with the first real color RC1 are used to form the first mask, and the nodes colored with the second real color RC2 are used to form the second mask. A hybrid lithography process is performed by the first exposure machine (e.g., EUV or 193d) having a first resolution (e.g. a shorter wavelength of ultraviolet light) with the first mask and the second exposure machine (e.g., 193i) having a second resolution (e.g. a longer wavelength of ultraviolet light) with the second mask. Due to advanced tool requirements for the second exposure machine being decreased, the manufacturing cost of the IC is decreased. By performing the first color propagation process and the second color propagation process to color the nodes corresponding to features in the layout, it is also check whether the layout is colorable for double patterning with hybrid lithographic.

In some embodiments, a multiple patterning decomposition method for an integrated circuit (IC) is provided. A layout of at least one layer of the IC is obtained, wherein the layout includes a plurality of features. The features of the layout are decomposed into a plurality of nodes. The nodes are classified to assign a plurality of first links and a plurality of second links between the nodes according to a decomposition condition, wherein the first links form a plurality of networks, and the networks include a portion of the second links and the networks are linked through the remaining second links. A first pseudo color and a second pseudo color are assigned to a pair of nodes of each of the first links in each of the networks. The second links having a pair of nodes both corresponding to the first pseudo color or the second pseudo color are identified in the networks. The nodes of the first links are uncolored, and a first real color is assigned to the two uncolored nodes of the identified second links in each of the networks. A second real color is assigned to the uncolored nodes connected to the nodes corresponding to the first real color through the first links in each of the networks. A first mask of the layer of the IC is formed according to the nodes corresponding to the first real color, and a second mask of the layer of the IC is formed according to the nodes corresponding to the second real color.

In some embodiments, a multiple patterning decomposition method for an integrated circuit (IC) is provided. A layout of at least one layer of the IC is obtained, wherein the layout includes a plurality of features. The features of the layout are decomposed into a plurality of nodes. The nodes are classified to assign a plurality of first links and a plurality of second links between the nodes according to a decomposition condition, wherein the first links form a plurality of networks, and the networks include a portion of the second links and the networks are linked through the remaining second links. A first color propagation process is performed to color the nodes with a first pseudo color and a second pseudo color through the first links. The second links having a pair of nodes both corresponding to the first pseudo color or the second pseudo color are identified in the networks. The nodes of the first links are uncolored, and a second color propagation process is performed to color the uncolored nodes based on the identified second links with a first real color and a second real color. A first mask of the layer of the IC is formed according to the nodes corresponding to the first real color, and a second mask of the layer of the IC is formed according to the nodes corresponding to the second real color.

In some embodiments, a method for manufacturing an integrated circuit (IC) is provided. A layout of at least one layer of the IC is obtained, wherein the layout includes a plurality of features. The features of the layout are decomposed into a plurality of nodes. A first mask corresponding to a portion of the nodes and a second mask corresponding to the remaining nodes are obtained. The IC is fabricated with a first exposure machine having a first resolution and the first mask. The IC is fabricated with a second exposure machine having a second resolution and the second mask. The first wavelength is shorter than the second wavelength.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiple patterning decomposition method for an integrated circuit (IC), comprising:
    obtaining a layout of at least one layer of the IC, wherein the layout comprises a plurality of features;
    decomposing the features of the layout into a plurality of nodes;
    classifying the nodes to assign a plurality of first links and a plurality of second links between the nodes according to a decomposition condition, wherein the first links form a plurality of networks, and the networks comprise a portion of the second links and the networks are linked through the remaining second links;
    assigning a first pseudo color and a second pseudo color to a pair of nodes of each of the first links in each of the networks;
    identifying the second links having a pair of nodes with the same pseudo color assigned in the first links of the networks;
    uncoloring the nodes of the first links, and assigning a first real color to the two uncolored nodes corresponding to the identified second links in each of the networks;
    assigning a second real color to the uncolored nodes connected to the nodes corresponding to the first real color through the first links in each of the networks; and
    forming a first mask of the layer of the IC according to the nodes corresponding to the first real color, and forming a second mask of the layer of the IC according to the nodes corresponding to the second real color.

2. The method as claimed in claim 1, further comprising:
    fabricating the IC with a first exposure machine having a first wavelength and the first mask; and
    fabricating the IC with a second exposure machine having a second wavelength and the second mask,
    wherein the first wavelength is shorter than the second wavelength.

3. The method as claimed in claim 1, further comprising:
    performing a color propagation process to assign the first and second real colors to the uncolored nodes through the first and second links,
    wherein the pair of nodes of the first link is assigned to different real colors.

4. The method as claimed in claim 3, wherein in the color propagation process, when one node of the pair of uncolored nodes of the second link is assigned to the second real color, the remaining uncolored node of the second link is assigned to the first real color, and when the one node of the pair of uncolored nodes of the second link is assigned to the first real color, the remaining uncolored node of the second link is assigned to the first or second real color.

5. The method as claimed in claim 1, wherein identifying the second links having the pair of nodes both corresponding to the first pseudo color or the second pseudo color in the networks further comprises:
    checking whether a conflict is present in the network, wherein the conflict indicates one of the second links having the pair of nodes both corresponding to the first pseudo color and the other second link having the pair of nodes both corresponding to the second pseudo color exist in the same network; and
    modifying the layout when the conflict is present in the network.

6. The method as claimed in claim 1, further comprising:
    checking whether the first links form a loop in each of the networks;
    determining whether the loop is an odd-cycle loop according to the number of first links and the number of nodes in the loop; and
    modifying the layout when the loop is the odd-cycle loop.

7. The method as claimed in claim 6, wherein the odd-cycle loop is a loop formed by an odd number of first links and an odd number of nodes.

8. The method as claimed in claim 1, wherein classifying the nodes to assign the first links and the second links between the nodes according to the decomposition condition further comprises:
    connecting the two adjacent nodes through the first link when a dimension between the features of the layout corresponding to the two adjacent nodes is less than a first threshold value of the decomposition condition; and
    connecting the two adjacent nodes through the second link when a dimension between the features of the layout corresponding to the two adjacent nodes is greater than or equal to the first threshold value and less than a second threshold value of the decomposition condition.

9. A multiple patterning decomposition method for an integrated circuit (IC), comprising:
    obtaining a layout of at least one layer of the IC, wherein the layout comprises a plurality of features;
    decomposing the features of the layout into a plurality of nodes;
    classifying the nodes to assign a plurality of first links and a plurality of second links between the nodes according to a decomposition condition, wherein the first links form a plurality of networks, and the networks comprise a portion of the second links and the networks are linked through the remaining second links;
    performing a first color propagation process to color the nodes with a first pseudo color and a second pseudo color through the first links;
    identifying the second links having a pair of nodes with the same pseudo color assigned in the first links of the networks;
    uncoloring the nodes of the first links, and performing a second color propagation process to color the uncolored nodes based on the identified second links with a first real color and a second real color; and
    forming a first mask of the layer of the IC according to the nodes corresponding to the first real color, and forming a second mask of the layer of the IC according to the nodes corresponding to the second real color.

10. The method as claimed in claim 9, further comprising:
    fabricating the IC with a first exposure machine having a first wavelength and the first mask; and fabricating the IC with a second exposure machine having a second wavelength and the second mask,
wherein the first wavelength is shorter than the second wavelength.

11. The method as claimed in claim 9, wherein in the second color propagation process, the pair of nodes of the first link is assigned to different real colors.

12. The method as claimed in claim 9, wherein in the second color propagation process, when one node of the pair of uncolored nodes of the second link is assigned to the second real color, the remaining uncolored node of the second link is assigned to the first real color, and when the one node of the pair of uncolored nodes of the second link is assigned to the first real color, the remaining uncolored node of the second link is assigned to the first or second real color.

13. The method as claimed in claim 9, wherein identifying the second links having the pair of nodes both corresponding to the first pseudo color or the second pseudo color in the networks further comprises:
checking whether a conflict is present in the network, wherein the conflict indicates one of the second links having the pair of nodes both corresponding to the first pseudo color and the other second link having the pair of nodes both corresponding to the second pseudo color exist in the same network; and
modifying the layout when the conflict is present in the network.

14. The method as claimed in claim 9, further comprising:
checking whether the first links form a loop in each of the networks;
determining whether the loop is an odd-cycle loop according to the number of first links and the number of nodes in the loop; and
modifying the layout when the loop is the odd-cycle loop.

15. The method as claimed in claim 14, wherein the odd-cycle loop is a loop formed by an odd number of first links and an odd number of nodes.

16. The method as claimed in claim 9, wherein classifying the nodes to assign the first links and the second links between the nodes according to the decomposition condition further comprises:
connecting the two adjacent nodes through the first link when a dimension between the features of the layout corresponding to the two adjacent nodes is less than a first threshold value of the decomposition condition; and
connecting the two adjacent nodes through the second link when a dimension between the features of the layout corresponding to the two adjacent nodes is greater than or equal to the first threshold value and less than a second threshold value of the decomposition condition.

17. A method for manufacturing an integrated circuit (IC), comprising:
obtaining a layout of at least one layer of the IC, wherein the layout comprises a plurality of features;
decomposing the features of the layout into a plurality of nodes;
classifying the nodes to assign a plurality of first links and a plurality of second links between the nodes according to a decomposition condition, wherein the first links form a plurality of networks, and the networks comprise a portion of the second links and the networks are linked through the remaining second links;
performing a first color propagation process to color the nodes with a first pseudo color and a second pseudo color through the first links;
uncoloring the nodes of the first links, and performing a second color propagation process to color the uncolored nodes corresponding to the second links having a pair of nodes with the same pseudo color assigned in advance, with a first real color and a second real color;
forming the first mask of the layer of the IC according to the nodes corresponding to the first real color, and forming the second mask of the layer of the IC according to the nodes corresponding to the second real color;
fabricating the IC with a first exposure machine having a first wavelength and the first mask; and
fabricating the IC with a second exposure machine having a second wavelength and the second mask,
wherein the first wavelength is shorter than the second wavelength.

18. The method as claimed in claim 17, wherein in the second color propagation process, the pair of nodes of the first link is assigned to different real colors, and when one node of the pair of uncolored nodes of the second link is assigned to the second real color, the remaining uncolored node of the second link is assigned to the first real color, and when the one node of the pair of uncolored nodes of the second link is assigned to the first real color, the remaining uncolored node of the second link is assigned to the first or second real color.

19. The method as claimed in claim 17, wherein classifying the nodes to assign the first links and the second links between the nodes according to the decomposition condition further comprises:
connecting the two adjacent nodes through the first link when a dimension between the features of the layout corresponding to the two adjacent nodes is less than a first threshold value of the decomposition condition; and
connecting the two adjacent nodes through the second link when a dimension between the features of the layout corresponding to the two adjacent nodes is greater than the first threshold value and less than a second threshold value of the decomposition condition.

20. The method as claimed in claim 17, further comprising:
checking whether the first links form a loop in each of the networks;
determining whether the loop is an odd-cycle loop according to the number of first links and the number of nodes in the loop; and
modifying the layout when the loop is the odd-cycle loop.

* * * * *